United States Patent
Alvarez et al.

(10) Patent No.: US 7,248,046 B2
(45) Date of Patent: Jul. 24, 2007

(54) DECOUPLING HIGH TEMPERATURE SUPERCONDUCTOR SENSOR ARRAYS IN NUCLEAR QUADRUPOLE RESONANCE DETECTION SYSTEMS

(75) Inventors: Robby L. Alvarez, Newark, DE (US); Charles Wilker, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/106,995

(22) Filed: Apr. 15, 2005

(65) Prior Publication Data
US 2005/0270028 A1 Dec. 8, 2005

Related U.S. Application Data

(60) Provisional application No. 60/562,479, filed on Apr. 15, 2004.

(51) Int. Cl.
*G01V 3/00* (2006.01)

(52) U.S. Cl. .................................. 324/300; 324/322

(58) Field of Classification Search ................ 324/318, 324/322, 300, 319, 314, 309, 307
See application file for complete search history.

(56) References Cited

U.S. PATENT DOCUMENTS

| | | |
|---|---|---|
| 4,514,691 A | 4/1985 | De Los Santos et al. |
| 5,036,279 A | 7/1991 | Jonsen |
| 5,206,592 A | 4/1993 | Buess et al. |
| 5,233,300 A | 8/1993 | Buess et al. |
| 5,262,394 A | 11/1993 | Wu et al. |
| 5,276,398 A * | 1/1994 | Withers et al. ............. 324/318 |
| 5,351,007 A | 9/1994 | Withers et al. |
| 5,457,385 A | 10/1995 | Sydney et al. |
| 5,583,437 A | 12/1996 | Smith et al. |
| 5,585,723 A * | 12/1996 | Withers ..................... 324/318 |
| 5,592,083 A | 1/1997 | Magnuson et al. |
| 5,594,338 A | 1/1997 | Magnuson |
| 5,656,937 A | 8/1997 | Cantor |
| 5,661,400 A | 8/1997 | Plies et al. |
| 5,750,473 A | 5/1998 | Shen |
| 5,751,146 A | 5/1998 | Hrovat |
| 5,804,967 A | 9/1998 | Miller et al. |
| 5,814,987 A | 9/1998 | Smith et al. |
| 5,814,989 A | 9/1998 | Smith et al. |
| 5,973,495 A * | 10/1999 | Mansfield .................... 324/322 |

(Continued)

FOREIGN PATENT DOCUMENTS

EP 0 426 851 5/1991

(Continued)

OTHER PUBLICATIONS

Stensgaard, A. "Optimized Design of the Shielded-Loop Resonator", Journal of Magnetic Resonance Series A 122, 120-125 (1996).*

(Continued)

*Primary Examiner*—Brij B. Shrivastav
(74) *Attorney, Agent, or Firm*—George M. Medwick

(57) ABSTRACT

The decoupling of an array of two or more closely spaced high temperature superconductor sensors can be accomplished by introducing a capacitive decoupling circuit.

16 Claims, 3 Drawing Sheets

U.S. PATENT DOCUMENTS

| | | |
|---|---|---|
| 5,986,455 A | 11/1999 | Magnuson |
| 5,999,000 A | 12/1999 | Srinivasan |
| 6,025,719 A | 2/2000 | Anderson |
| 6,054,856 A | 4/2000 | Garroway et al. |
| 6,091,240 A | 7/2000 | Smith et al. |
| 6,104,190 A | 8/2000 | Buess et al. |
| 6,108,569 A | 8/2000 | Shen |
| 6,150,816 A | 11/2000 | Srinivasan |
| 6,166,541 A | 12/2000 | Smith et al. |
| 6,169,399 B1 | 1/2001 | Zhang et al. |
| 6,194,898 B1 | 2/2001 | Magnuson et al. |
| 6,201,392 B1 * | 3/2001 | Anderson et al. ........... 324/300 |
| 6,218,943 B1 | 4/2001 | Ellenbogen |
| 6,242,918 B1 | 6/2001 | Miller et al. |
| 6,291,994 B1 | 9/2001 | Kim et al. |
| 6,335,622 B1 | 1/2002 | James et al. |
| 6,370,404 B1 | 4/2002 | Shen |
| D459,245 S | 6/2002 | Power |
| 6,420,872 B1 | 7/2002 | Garroway et al. |
| 6,486,838 B1 | 11/2002 | Smith et al. |
| 6,538,445 B2 * | 3/2003 | James et al. ................ 324/322 |
| 6,556,013 B2 | 4/2003 | Withers |
| 6,566,873 B1 | 5/2003 | Smith et al. |
| 6,590,394 B2 | 7/2003 | Wong et al. |
| 6,751,489 B2 | 6/2004 | Shen |
| 6,777,937 B1 | 8/2004 | Miller et al. |
| 6,819,109 B2 | 11/2004 | Sowers et al. |
| 7,091,721 B2 * | 8/2006 | Jevtic ........................ 324/318 |
| 2002/0068682 A1 | 6/2002 | Shen |
| 2002/0153891 A1 | 10/2002 | Smith et al. |
| 2002/0169374 A1 * | 11/2002 | Jevtic ........................ 600/422 |
| 2002/0190715 A1 | 12/2002 | Marek |
| 2003/0062898 A1 | 4/2003 | Wong et al. |
| 2003/0071619 A1 | 4/2003 | Sauer et al. |
| 2004/0222790 A1 | 11/2004 | Karmi et al. |

FOREIGN PATENT DOCUMENTS

| | | | |
|---|---|---|---|
| EP | 1 168 483 | | 1/2002 |
| GB | 2 286 248 | | 8/1995 |
| GB | 2 289 344 | | 11/1995 |
| GB | WO 99/45409 | * | 9/1999 |
| WO | WO 92/19978 | | 11/1992 |
| WO | WO 92/21989 | | 12/1992 |
| WO | WO 94/05022 | | 3/1994 |
| WO | WO 95/34096 | | 12/1995 |
| WO | WO 96/39636 | | 12/1996 |
| WO | WO 98/37438 | | 8/1998 |
| WO | WO 98/54590 | | 12/1998 |
| WO | WO 99/45409 | | 9/1999 |
| WO | WO 99/50689 | | 10/1999 |
| WO | WO 00/70356 | | 11/2000 |
| WO | WO 02/098364 | | 12/2002 |
| WO | WO 03/014700 | | 2/2003 |
| WO | WO 03/040761 | | 5/2003 |
| WO | WO 03/096041 | | 11/2003 |

OTHER PUBLICATIONS

Miller, et al., "Performance of a High-Temperature Superconducting Probe for In Vivo Microscopy at 2.0 T", Magnetic Resonance in Medicine, (1999) pp. 72-79, vol. 41.

W.H. Wong, et al., "HTS Coils for High Resolution Nuclear Magnetic Resonance Spectroscopy", Advances in Cryogenic Engineering, (1996), pp. 953-959, New York.

Kushida, et al., "Dependence of the Pure Quadrupole Resonance Frequency on Pressure and Temperature", Physical Review, (Dec. 1956), pp. 1364-1377, vol. 104, No. 5, Massachusetts.

Vanier, "Temperature Dependence of the Pure Nuclear Quadrupole Resonance Frequency in KC103", Canadian Journal of Physics, (Nov. 1960), pp. 1397-1405, vol. 38, No. 11, Canada.

Smith, et al., "Nitrogen Electric Quadrupole and Proton Magnetic Resonances in Thiourea", Journal of Chemical Physics, (Oct. 1964), pp. 2403-2416, vol. 41, No. 8, New York.

T. Hirschfeld, "Short Range Remote Nqr Measurements", Journal of Molecular Structure, (1980) pp. 63-77, vol. 58, Elsevier Scientific Publishing Company, Amsterdam.

Garroway, et al., "Remote Sensing by Nuclear Quadrupole Resonance", IEEE Transactions on Geoscience and Remote Sensing, Jun. 2001, pp. 1108-1118, vol. 39, No. 6.

Garroway, et al., "Narcotics and explosives detection by N pure NQR", SPIE, (1993) pp. 318-327, vol. 2092.

Charles Wilker, "HTS Sensors for NQR Spectroscopy", vol. 1, pp. 143-146, 2004.

He, D.F. et al., " Metal detector based on high-Tc RF SQUID", Physica C 378-381 (2002) pp. 1404-1407.

* cited by examiner

DECOUPLING HIGH TEMPERATURE SUPERCONDUCTOR SENSOR ARRAYS IN NUCLEAR QUADRUPOLE RESONANCE DETECTION SYSTEMS

This application claims the benefit of U.S. Provisional Application Ser. No. 60/562,479, filed on Apr. 15, 2004, which is incorporated in its entirety as a part hereof for all purposes.

FIELD OF THE INVENTION

This invention relates to the decoupling of an array of two or more high temperature superconductor sensors in a nuclear quadrupole resonance detection system.

BACKGROUND OF THE INVENTION

The use of nuclear quadrupole resonance (NQR) as a means of detecting explosives and other contraband has been recognized for some time. See for example T. Hirshfield et al, *J. Molec. Struct.* 58, 63 (1980); A. N. Garroway et al, *Proc. SPIE* 2092, 318 (1993); and A. N. Garroway et al, *IEEE Trans. on Geoscience and Remote Sensing* 39, 1108 (2001). NQR provides some distinct advantages over other detection methods. NQR requires no external magnet such as required by nuclear magnetic resonance. NQR is sensitive to the compounds of interest, i.e. there is a specificity of the NQR frequencies.

One technique for measuring NQR in a sample is to place the sample within a solenoid coil that surrounds the sample. The coil provides a radio frequency (RF) magnetic field that excites the quadrupole nuclei in the sample and results in their producing their characteristic resonance signals. This is the typical apparatus configuration that might be used for scanning mail, baggage or luggage. There is also a need for a NQR detector that permits detection of NQR signals from a source outside the detector, e.g. a wand detector, that could be passed over persons or containers as is done with existing metal detectors. Problems associated with such detectors using conventional systems are the decrease in detectability with distance from the detector coil, and the associated equipment needed to operate the system.

A detection system can have one or more coils that both transmit and receive, or it can have separate coils that only transmit and only receive. A transmit, or transmit and receive, coil of an NQR detection system provides a radio frequency (RF) magnetic field that excites the quadrupole nuclei in the sample and results in the production of their characteristic resonance signals that the receive, or transmit and receive, coil, i.e. the sensor, detects.

The NQR signals have low intensity and short duration. The transmit, receive, or transmit and receive, coil preferably has a high quality factor (Q). The transmit, receive, or transmit and receive, coil has typically been a copper coil and therefore has a Q of about $10^2$. It can be advantageous to use a transmit, receive, or transmit and receive, coil made of a high temperature superconductor (HTS) rather than copper since the HTS self-resonant coil has a Q of the order of $10^4$–$10^6$.

The large Q of the HTS self-resonant coil produces large magnetic field strengths during the RF transmit pulse and does so at lower RF power levels. This dramatically reduces the amount of transmitted power required to produce NQR signals for detection, and thereby reduces the size of the RF power supply sufficiently so that it can be run on portable batteries. The large Q of the HTS self-resonant coil plays a very important role during reception. In view of the low intensity of the NQR signal, it is important to have a signal-to-noise ratio (S/N) as large as possible. The signal-to-noise (S/N) ratio is proportional to the square root of Q so that the use of the HTS self-resonant coil as a sensor results in an increase in S/N by a factor of 10–100 over that of a copper coil sensor.

It is often advantageous to use an array of two or more closely spaced HTS sensors in a NQR detection system. However, coupling of the coils can interfere with system performance. As a result, an object of the present invention is to provide a NQR detection system comprising an array of two or more HTS sensors wherein the HTS sensors have been decoupled.

SUMMARY OF THE INVENTION

This invention provides a nuclear quadrupole resonance detection system with an array of n high temperature superconductor sensors wherein $n \geq 2$, and wherein the system includes a capacitive decoupling circuit to decouple the n sensors.

Preferably, the sensors are used solely for detecting, i.e. receiving, the NQR signals, and a separate coil is used as the transmit coil. Preferably, the HTS sensors are each comprised of a high temperature superconductor self-resonant planar coil, or two or more coupled high temperature superconductor self-resonant planar coils.

Decoupling the sensors is especially useful when the nuclear quadrupole resonance detection system is being used for detecting the nuclear quadrupole resonance of explosives, drugs and other contraband.

DETAILED DESCRIPTION OF THE PREFERRED EMBODIMENTS

It can be advantageous to use more than a single sensor in a nuclear quadrupole resonance detection system. The multiple sensors can be

- tuned to different nuclear quadrupole resonance frequencies of a selected target compound to be detected,
- tuned to different nuclear quadrupole resonance frequencies of more than one target compound,
- tuned to the same nuclear quadrupole resonance frequency and their signals coherently combined to improve the signal-to-noise ratio, or
- tuned to various frequencies within a range of frequencies wherein the range of frequencies is determined by the uncertainty in the temperature of a sample containing a target compound and by the corresponding uncertainty in the NQR frequency of the target compound in the sample.

In a typical NQR detection system a sensor will be coplanar with other sensors and in many of the detection systems the sensors will be closely spaced. There is a coupling between these sensors as a result of the mutual inductance between them. This coupling between two sensors increases as the distance between them decreases. The problem of the coupling between sensors is exacerbated when using HTS sensors because of the very large Q's of the HTS sensors. This coupling of sensors can have serious effects on the performance of the NQR detection system.

In one embodiment of this invention, involving for example two sensors, a capacitive decoupling circuit as used herein is comprised of two decoupling loops, each of which is inductively coupled to one of the sensors, and a capacitor connected to the decoupling loops. This embodiment is shown schematically in FIG. 1. Two high temperature superconductor sensors 1,2 are in the form of HTS planar coils. The HTS sensors 1,2 are on substrates 3,4 respectively. The centers of the HTS planar coils are separated by a distance d. The sensors 1,2 are coupled as a result of their mutual inductance. As the distance d between their centers decreases the coupling increases.

Figure 1:
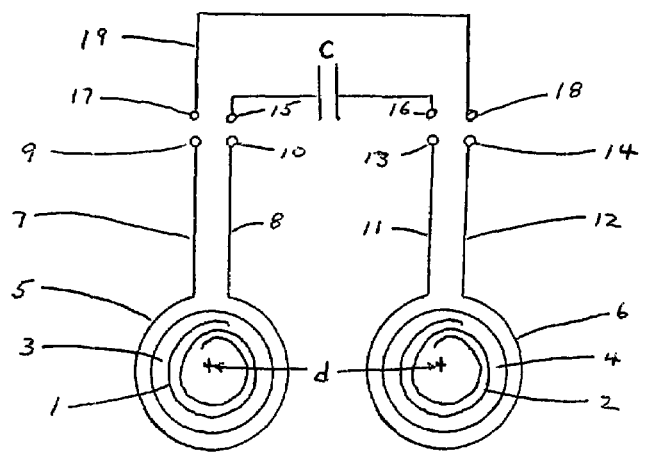
FIG. 1 shows a schematic drawing of two HTS sensors, each of which has a decoupling loop inductively coupled to it with a decoupling capacitance connected to the two decoupling loops.

The sensors are shown with decoupling loops 5,6 that are inductively coupled to the sensors 1,2 respectively. A decoupling loop as used herein can be a single loop or a coil, and can be made from a high temperature superconductor or from a conducting metal such as copper. Electrical conductors 7,8 are connected to the ends of loop 5 and lead to electrodes 9,10 respectively. Electrical conductors 11,12 are connected to the ends of loop 6 and lead to electrodes 13,14 respectively. A capacitor of capacitance C is shown connected to electrodes 15,16. Electrodes 17,18 are shown connected by electrical conductor 19. In this embodiment of the invention the sensors are decoupled by connecting capacitance C to the loops 5,6, i.e. by connecting electrode 10 to electrode 15, electrode 13 to electrode 16, electrode 9 to electrode 17 and electrode 14 to electrode 18. The capacitive decoupling circuit can contain a single capacitor as shown in FIG. 1, and the capacitor can have a fixed value or be variable. Alternatively, the capacitive decoupling circuit can be comprised of two, three, four or more capacitors arranged in various configurations.

Figure 2:
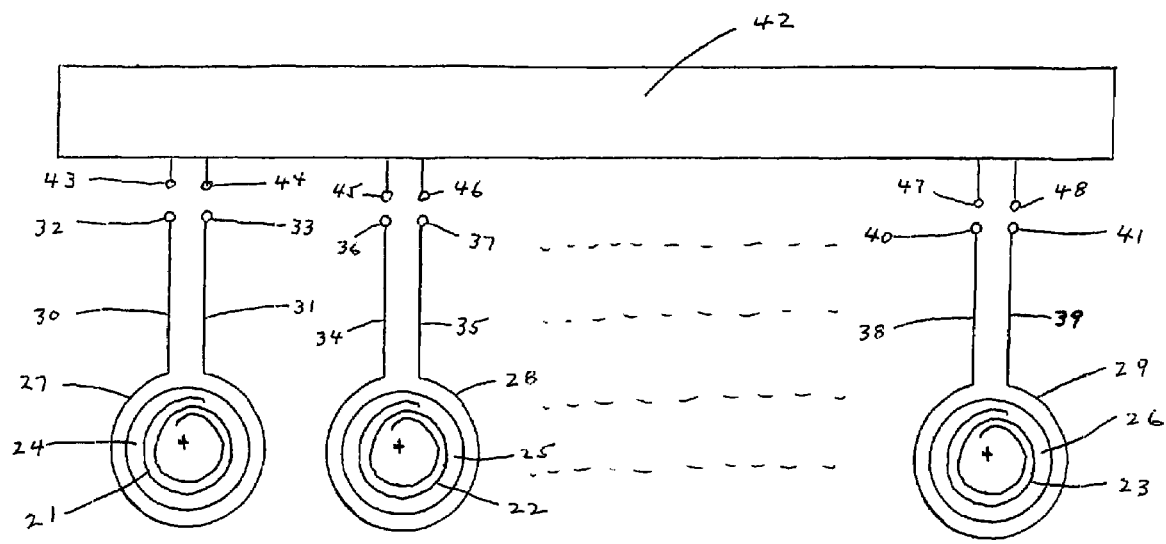
FIG. 2 shows a schematic drawing of n HTS sensors, each of which has a decoupling loop inductively coupled to it with a capacitive decoupling circuit connected to the various decoupling loops.

In another embodiment of this invention, involving for example an array of n sensors, the capacitive decoupling circuit is comprised of n decoupling loops with one decoupling loop inductively coupled to each of the n sensors, and a capacitive network connected to the n decoupling loops. This embodiment is shown schematically in FIG. 2. For simplicity, only the first sensor 21, the second sensor 22 and the nth sensor 23 are shown. The sensors 21, 22 and 23 are on substrates 24, 25 and 26, respectively. The sensors are shown with decoupling loops 27, 28 and 29 that are inductively coupled to the sensors 21, 22 and 23, respectively. Electrical conductors 30, 31 are connected to the ends of loop 27 and lead to electrodes 32 and 33, respectively. Electrical conductors 34, 35 are connected to the ends of loop 28 and lead to electrodes 36 and 37, respectively. Electrical conductors 38, 39 are connected to the ends of loop 29 and lead to electrodes 40 and 41, respectively. A capacitive network 42 with n pairs of electrodes, one pair for each of the n sensors, is used to decouple the array of n sensors. Again for simplicity, only 3 pairs of electrodes are shown, pair 43/44, pair 45/46, and pair 47/48. The capacitive network 42 is connected to the n loops by connecting the various electrodes, 32 to 43, 33 to 44, 36 to 45, 37 to 46, 40 to 47, 41 to 48, etc.

A capacitive network is typically comprised of a sufficient number of capacitors so that a selected capacitor is dedicated to a selected pair of sensors, i.e. a capacitor connected to the decoupling loops for one pair of sensors is not connected to the decoupling loop for any other sensor. The capacitive network can be comprised of capacitors that have fixed values or that are variable. In one embodiment, the capacitive network connects a single capacitor to the decoupling loops for each adjacent pair of sensors. In an alternative embodiment, the capacitive network connects a single capacitor to the decoupling loops for each adjacent pair of sensors as well as to the decoupling loops for pairs of sensors that are more distant, i.e. that are not adjacent to each other. In a further embodiment, capacitors are connected to decoupling loops for all pairs of sensors to decouple them. The capacitive network can be comprised of two, three, four or more capacitors arranged in various configurations that may be the same or different, such as series and/or parallel configurations, for each of the connections to decoupling loops that are present in the system. The capacitive network thus includes the various different ways in which one or more capacitors can be interconnected with decoupling loops that are provided for the various different pairs of sensors in the NQR detection system for which decoupling is desired.

The coils used to detect the nuclear quadrupole resonance signals can be used only as receive coils (to only receive NQR signals), or can be used as transmit and receive coils. Preferably, however, separate coils are used to transmit the RF signal and to detect any NQR signals, and the sensors (such as those that are decoupled by the system described above) are used solely as receive coils, i.e. to detect the nuclear quadrupole resonance signals.

The transmit coils used can be made of a high temperature superconductor, or can be made of conventional metals such as copper, silver or aluminum. A conventional metal coil is preferably in the form of a shielded-loop resonator (SLR) coil. SLR's have been developed to minimize the detuning effect of the electrical interaction between the coil and the surrounding material. Preferably, one or more SLR copper transmit coils are used to apply the RF signal to the sample.

It is often advantageous to be able to fine-tune the resonance frequency of the sensor. One means for accomplishing such tuning is to use a sensor comprised of two or more coupled high temperature superconductor self-resonant coils. The resonance frequency of the fundamental symmetric mode of the two or more coupled high temperature superconductor self-resonant coils can be varied by mechanically displacing the coils with respect to one another, and these coupled coils can serve as the HTS sensor. Preferably, the coupled self-resonant coils are planar, i.e. surface, coils. Each planar coil can have a HTS coil configuration on only one side of the substrate, or can have essentially identical HTS coil configurations on both sides of the substrate.

As indicated above, when two or more coupled high temperature superconductor self-resonant coils are used as a sensor, the resonance frequency of the fundamental symmetric mode of the two or more coupled high temperature superconductor self-resonant coils can be varied by mechanically displacing one or more coils with respect to the others, and this is one means to tune the resonance frequency of the sensor to a specified frequency. Alternatively, for a sensor comprised of a high temperature superconductor self-resonant coil or two or more coupled high temperature superconductor self-resonant coils, a circuit can be used to provide the tuning of the resonance frequency of the sensor to a specified frequency. The circuit may be comprised of a single loop or coil inductively coupled to the high temperature superconductor self-resonant sensor, a reactance in series with the single loop or coil, and means to connect the reactance to, and disconnect the reactance from, the single loop or coil. Preferably, the means to connect the reactance to, and disconnect the reactance from, the single loop or coil is comprised of at least one mechanical switch or electrical switch such as a diode.

The reactance can be an inductance, capacitance or combination of both. Preferably, the reactance can be varied so that the resonance frequency can be adjusted to more than one frequency. A variable reactance may be provided, for example, where the reactance includes two or more capacitors in parallel, each of which can be individually connected to or disconnected from the single loop or coil. Alternatively, a variable reactance may be provided in the form of two or more inductors in series, each of which can be individually connected to or disconnected from the single loop or coil by a mechanical or electrical switch that can short-circuit the inductor and thereby essentially remove it from the circuit. For the sensors shown in FIG. 1, for example, a reactance would be connected across electrodes 9 and 10 to adjust the resonance frequency of sensor 1, and a reactance would be connected across electrodes 13 and 14 to adjust the resonance frequency of sensor 2.

Preferably, the high temperature superconductor (HTS) sensors are HTS coils in the form of a self-resonant planar coil, i.e. a surface coil, with a coil configuration of HTS on one side of a substrate, or with essentially identical HTS coil configurations on both sides of the substrate. High temperature superconductors are those that superconduct above 77K. The high temperature superconductors used to form the HTS self-resonant coil are preferably selected from the group consisting of $YBa_2Cu_3O_7$, $Tl_2Ba_2CaCu_2O_8$, $TlBa_2Ca_2Cu_3O_9$, $(TlPb)Sr_2CaCu_2O_7$ and $(TlPb)Sr_2Ca_2Cu_3O_9$. Most preferably, the high temperature superconductor is $YBa_2Cu_3O_7$ or $Tl_2Ba_2CaCu_2O_8$. An HTS self-resonant coil can be formed by various known techniques. A preferable technique for forming a $Tl_2Ba_2CaCu_2O_8$ coil is described in Example 1.

An NQR detection system comprised of an array of two or more high temperature superconductor sensors can be used to detect the presence of chemical compounds for any purpose, but is particularly useful for detecting the presence of controlled substances such as explosives, drugs or contraband of any kind. Such an NQR detection system could be usefully incorporated into a safety system, a security system, or a law enforcement screening system. Such systems would typically include a mechanical system for automatically moving objects to be scanned into and out of the range of the scanner, and may also include an enclosure in which objects to be subjected to NQR scanning could be placed and shielded from the environment during the test. Where such an enclosure is used, the mechanical system would automatically moving objects to be scanned into and out of the enclosure.

EXAMPLE 1

Example 1 demonstrates the decoupling of an array of two sensors by means of a capacitive decoupling circuit comprised of two decoupling loops, each of which is inductively coupled to one of the sensors, and a capacitor connected to the decoupling loops.

Each HTS sensor is comprised of two coupled essentially identical $Tl_2Ba_2CaCu_2O_8$ planar coils. Each of the coupled coils is on a lanthanum aluminate ($LaAlO_3$) substrate with the coil design configuration shown in FIG. 3 on both sides of the substrate.

A clean, polished single crystal $LaAlO_3$ substrate with a diameter of 2 inches (5.1 cm) and an approximate thickness of 0.02 inches (0.5 mm) may be obtained from Litton Airtron, Morris Plains, N.J. Off-axis magnetron sputtering of a Ba:Ca:Cu oxide target is used to deposit, at ambient temperature, an amorphous precursor Ba:Ca:Cu oxide film on both sides of the substrate. This amorphous Ba:Ca:Cu oxide film is about 550 nm thick and had a stoichiometry of about 2:1:2. The precursor film is then thallinated by annealing it in air for about 45 minutes at 850° C. in the presence of a powder mixture of $Tl_2Ba_2Ca_2Cu_3O_{10}$ and $Tl_2O_3$. When this powder mixture is heated, $Tl_2O$ evolves from the powder mixture, diffuses to the precursor film and reacts with it to form the $Tl_2Ba_2CaCu_2O_8$ phase.

Figure 3:
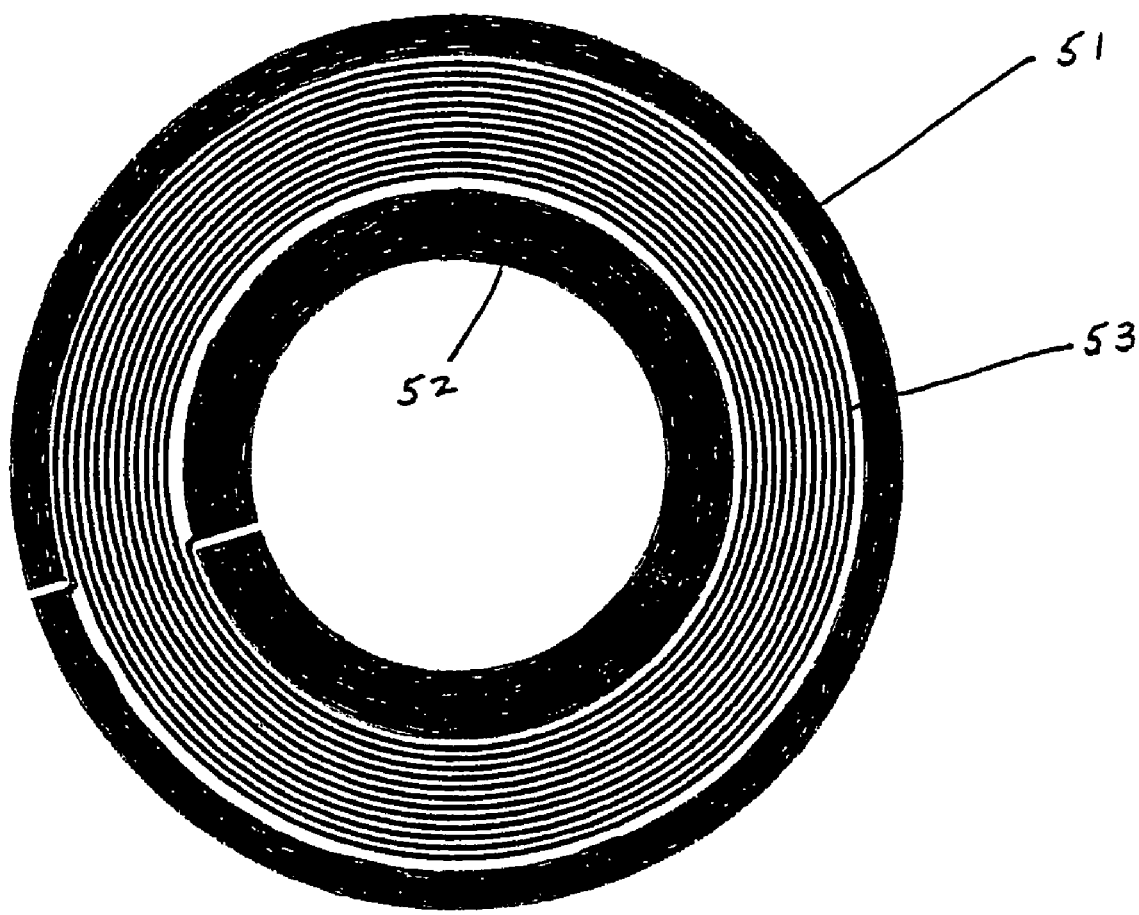
FIG. 3 shows the HTS coil design of the HTS coils used as sensors in the Example 1.

The sample is then coated with photoresist on both sides and baked. A coil design mask with the design shown in FIG. 3 is prepared. The coil has an inner radius of about 10.5 mm and an outer radius of about 22.5 mm. The outermost HTS ring 51 of the coil is about 2 mm wide and the innermost HTS ring 52 is about 3.5 mm wide. The intermediate HTS rings 53 are about 250 μm wide with about 250 μm gaps between the rings. The coil design mask is then centered on the photoresist covering the $Tl_2Ba_2CaCu_2O_8$ film on the front side of the substrate and exposed to ultraviolet light. The coil design mask is then centered on the photoresist covering the $Tl_2Ba_2CaCu_2O_8$ film on the back side of the substrate and exposed to ultraviolet light. The resist is then developed on both sides of the substrate and the portion of the $Tl_2Ba_2CaCu_2O_8$ film exposed when the resist is developed is etched away by argon beam etching. The remaining photoresist layer is then removed by an oxygen plasma.

The result is a planar coil structure comprised of the single crystal $LaAlO_3$ substrate with a high temperature superconductor $Tl_2Ba_2CaCu_2O_8$ pattern of the configuration shown in FIG. 3 centered on each side of the single crystal $LaAlO_3$ substrate. The process is repeated three times in essentially the same way to produce three planar coils essentially identical to the first. Two of the essentially identical planar coils are used to form one HTS sensor and the other two essentially identical planar coils are used to form the second HTS sensor. The HTS patterns 87 and 88 on the upper sides of the $LaAlO_3$ substrates 65 and 66 are indicted in FIG. 4A. The distance between the centers of the two sensors is about 8 cm. The Q's of the sensors are in the range of 10,000–20,000.

Figure 4A:
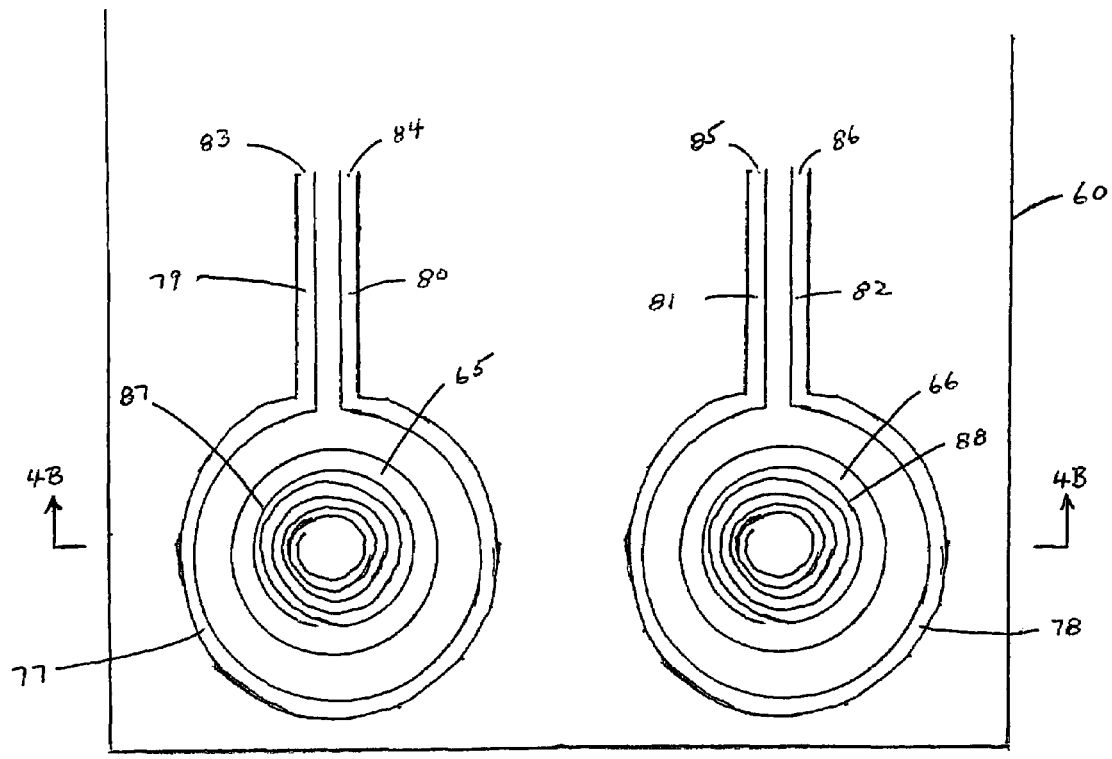
FIGS. 4A and 4B show the holder that is used in the Example 1 to hold the HTS sensors and the decoupling loops that inductively couple to the HTS sensors.
Figure 4B:
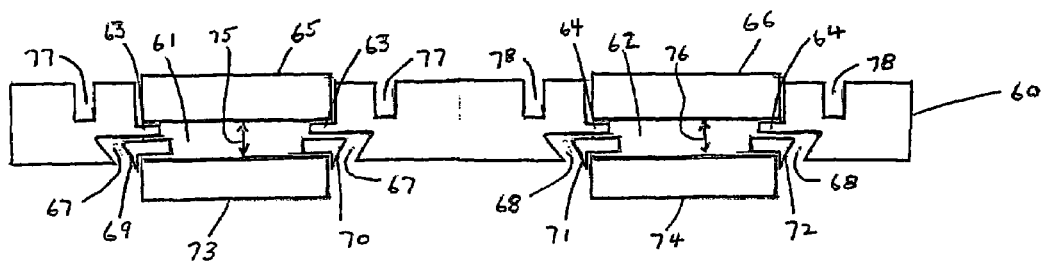

FIG. 4A is a schematic drawing of the top view of holder 60 that holds the two HTS sensors and two copper decoupling loops. FIG. 4B is a cross section of the holder 60 taken at points "4B"—"4B" of FIG. 4A. The holder 60 is a fiberglass epoxy laminate. Two circular holes 61, 62 of radius about ⅞ inch (2.2 cm) are cut near one end of the sample holder 60. Two other holes, concentric with the holes 61, 62 and with radii of about 1 inch (2.5 cm) are cut leaving ledges 63, 64 to hold the $LaAlO_3$ substrates 65, 66 as shown. On the opposite sides of ledges 63 and 64, cut-outs 67, 68 are made to accommodate moveable substrate holders 69, 70 and 71, 72 that serve to hold the other $LaAlO_3$ substrates 73, 74. The moveable substrate holders 69,70 and 71,72 also serve to translate the $LaAlO_3$ substrates 73 and 74 laterally, i.e. horizontally, with respect to $LaAlO_3$ substrates 65 and 66, respectively. This thereby enables the resonance frequency of each of the HTS sensors, i.e. each of the pairs of two coupled planar HTS coils, to be fine tuned. The distance 75 between the two $LaAlO_3$ substrates 65 and 73 is 1 mm. The distance 76 between the two $LaAlO_3$ substrates 66 and 74 is 1 mm.

Circular grooves 77 and 78 of radius about 1.1 inch (2.8 cm) surrounding and concentric with the $LaAlO_3$ substrates 65 and 66, respectively, are cut into the surface of the sample holder 60 along with parallel grooves 79,80 and 81,82. A piece of 18 American Wire Gauge copper wire, not shown, is placed in parallel groove 79 beginning at point 83 and extending along groove 79 to the circular groove 77, around circular groove 77 to parallel groove 80, and along groove 80 to point 84. Similarly, a piece of 18 American Wire Gauge copper wire, not shown, is placed in parallel groove 81 beginning at point 85 and extending along groove 81 to the circular groove 78, around circular groove 78 to parallel groove 82, and along groove 82 to point 86. The copper wires in the circular grooves 77 and 78 serve as decoupling loops to inductively couple the HTS sensors to a capacitor.

It is attempted to tune the resonance frequency of each of the sensors to 3.6 MHz. They could not be tuned to the same frequency because of their mutual inductance. At closest approach in frequency, the separation in resonance frequencies is about 20 kHz indicating a coupling coefficient of about $5 \times 10^{-3}$. A 300 pF low-loss capacitor is connected to points 84 and 85 and a copper wire is connected to points 83 and 86. It is again attempted to tune the resonance frequency of each of the sensors to 3.6 MHz. At closest approach in frequency, the separation in resonance frequencies is no more than 500 Hz indicating a coupling coefficient no larger than $1 \times 10^{-6}$. The large decrease in coupling coefficient is not very sensitive to the magnitude of the capacitance. The capacitance could be varied by ±10% with similar results.

These results demonstrate the decoupling of HTS sensors using a capacitive decoupling circuit.

Where an apparatus or method of this invention is stated or described as comprising, including, containing, having, being composed of or being constituted by certain components or steps, it is to be understood, unless the statement or description explicitly provides to the contrary, that one or more components or steps other than those explicitly stated or described may be present in the apparatus or method. In an alternative embodiment, however, the apparatus or method of this invention may be stated or described as consisting essentially of certain components or steps, in which embodiment components or steps that would materially alter the principle of operation or the distinguishing characteristics of the apparatus or method would not be present therein. In a further alternative embodiment, the apparatus or method of this invention may be stated or described as consisting of certain components or steps, in which embodiment components or steps other than those as stated or described would not be present therein.

Where the indefinite article "a" or "an" is used with respect to a statement or description of the presence of a component in an apparatus, or a step in a method, of this invention, it is to be understood, unless the statement or description explicitly provides to the contrary, that the use of such indefinite article does not limit the presence of the component in the apparatus, or of the step in the method, to one in number.

What is claimed is:

1. A nuclear quadrupole resonance detection system comprising:
    a) an array of n high temperature superconductor sensors, wherein $n \geq 2$,
        wherein the n high temperature superconductor sensors only receive nuclear quadrupole resonance signals, and
        wherein the n high temperature superconductor sensors are each comprised of at least one high temperature superconductor self-resonant planar coil;
    b) one or more copper, silver or aluminum shielded-loop resonator coils for applying an RF excitation signal to a sample to be scanned for nuclear quadrupole resonance, the excitation signal being operative to excite the quadrupolar nuclei of the sample; and
    c) a capacitive decoupling circuit to decouple the n sensors,
        wherein the capacitive decoupling circuit includes n decoupling loops,
        wherein one decoupling loop is inductively coupled to each of the n sensors, and
        wherein each of the n decoupling loops is connected to a capacitive network.

2. The detection system of claim 1 wherein the capacitive network connects a single capacitor to each adjacent pair of decoupling loops, and
    wherein a selected capacitor is connected to a selected pair of decoupling loops and is not connected to any other decoupling loop.

3. The detection system of claim 2 wherein a capacitor has a fixed capacitance.

4. The detection system of claim 2 wherein a capacitor is variable.

5. A security system, a safety system or a law enforcement screening system comprising the nuclear quadrupole resonance detection system of claim 2.

6. The detection system of claim 1 wherein the capacitive network connects a single capacitor to each adjacent pair of decoupling loops,
    wherein the capacitive network connects a single capacitor to pairs of decoupling loops that are not adjacent, and
    wherein a selected capacitor is connected to a selected pair of decoupling loops and is not connected to any other decoupling loop.

7. The detection system of claim 6 wherein a capacitor has a fixed capacitance.

8. The detection system of claim 6 wherein a capacitor is variable.

9. A security system, a safety system or a law enforcement screening system comprising the nuclear quadrupole resonance detection system of claim 6.

10. The detection system of claim 1 wherein the capacitive network connects a single capacitor to each pair of decoupling loops, and
    wherein a selected capacitor is connected to a selected pair of decoupling loops and is not connected to any other decoupling loop.

11. The detection system of claim 10 wherein a capacitor has a fixed capacitance.

12. The detection system of claim 10 wherein a capacitor is variable.

13. The detection system of claim 1 wherein the capacitive network is comprised of three or more capacitors arranged in the same or different configurations for each of the connections of a capacitor to a pair of decoupling loops.

14. The detection system of claim 1 wherein each high temperature superconductor self-resonant planar coil is comprised of a substrate and a high temperature superconductor coil configuration on one side of the substrate.

15. The detection system of claim 1 wherein each high temperature superconductor self-resonant planar coil is comprised of a substrate and a high temperature superconductor coil configuration on both sides of the substrate.

16. A security system, a safety system or a law enforcement screening system comprising the nuclear quadrupole resonance detection system of claim 1.

* * * * *